(12) United States Patent
Takahashi et al.

(10) Patent No.: US 8,649,738 B2
(45) Date of Patent: Feb. 11, 2014

(54) HIGH-FREQUENCY AMPLIFIER AND RADIO COMMUNICATION APPARATUS

(75) Inventors: Katsuaki Takahashi, Kanagawa (JP); Noboru Sasho, Tokyo (JP); Naoto Yoshikawa, Tokyo (JP); Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 293 days.

(21) Appl. No.: 12/923,763

(22) Filed: Oct. 7, 2010

(65) Prior Publication Data
US 2011/0098013 A1   Apr. 28, 2011

(30) Foreign Application Priority Data
Oct. 27, 2009   (JP) .................................. 2009-246539

(51) Int. Cl.
*H04B 1/38* (2006.01)
(52) U.S. Cl.
USPC ............. 455/73; 455/290; 455/340; 455/341; 343/860; 330/302
(58) Field of Classification Search
None
See application file for complete search history.

(56) References Cited

U.S. PATENT DOCUMENTS

| | | | | |
|---|---|---|---|---|
| 6,765,540 B2 * | 7/2004 | Toncich | ......................... | 343/860 |
| 6,825,818 B2 * | 11/2004 | Toncich | ......................... | 343/860 |
| 6,963,247 B2 * | 11/2005 | Sivonen et al. | ................ | 330/302 |
| 7,599,675 B2 * | 10/2009 | Mu et al. | ..................... | 455/240.1 |
| 7,786,806 B2 * | 8/2010 | Duperray | ........................ | 330/311 |
| 2009/0170456 A1 * | 7/2009 | Kuo et al. | ................... | 455/150.1 |
| 2010/0062727 A1 * | 3/2010 | Kemmochi et al. | .............. | 455/74 |

FOREIGN PATENT DOCUMENTS

JP    2008-160660    7/2008

* cited by examiner

*Primary Examiner* — Fayyaz Alam
*Assistant Examiner* — Mohammed Rachedine
(74) *Attorney, Agent, or Firm* — Rader, Fishman & Grauer PLLC

(57) ABSTRACT

A high-frequency amplifier includes: an amplification section having a function to convert an input signal from a voltage signal into a current signal and output the current signal; output terminals; and a load circuit which is connected to the output node of the amplification section and outputs the current signal output by the amplification section to the output terminals as a voltage signal.

19 Claims, 4 Drawing Sheets

HIGH-FREQUENCY AMPLIFIER AND RADIO COMMUNICATION APPARATUS

BACKGROUND OF THE INVENTION

1. Field of the Invention

The present invention relates to a high-frequency amplifier applicable to the front-end section of a radio communication apparatus such as a television tuner and also relates to the radio communication apparatus employing the high-frequency amplifier.

2. Description of the Related Art

In most cases, an LC resonator is used as a load borne by a high-frequency amplifier employed in a receiver in which only a desired frequency is selected by imposing band limits on RFs (radio frequencies) of received signals.

Figure 1:
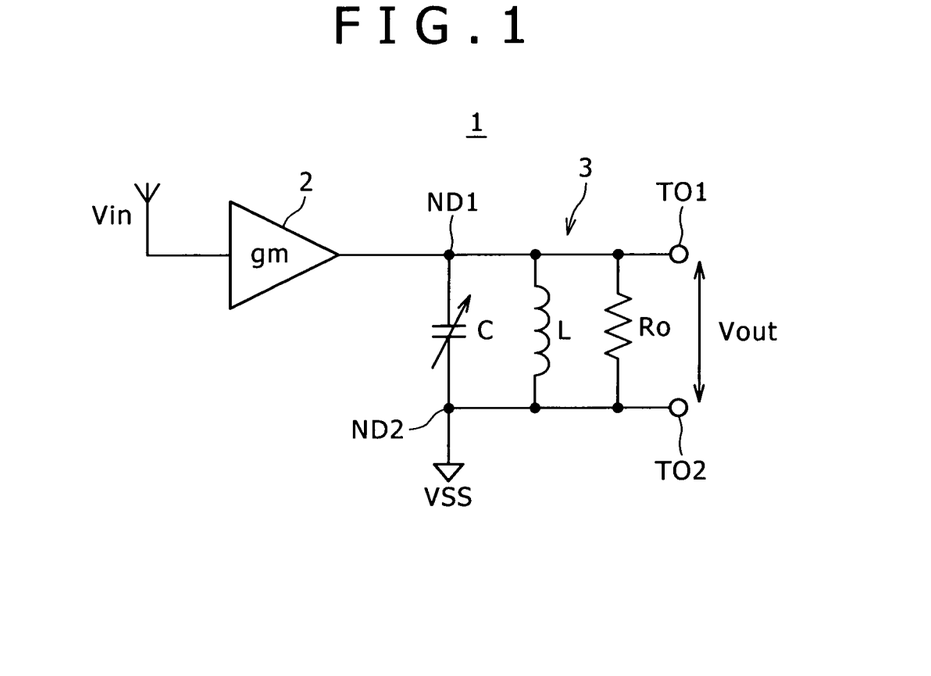
FIG. 1 is a circuit diagram showing a typical configuration of a high-frequency amplifier employed in a front-end circuit to serve as an amplifier which has a parallel LC resonator to serve as a load borne by an amplification section of the amplifier.

FIG. 1 is a circuit diagram showing a typical configuration of a high-frequency amplifier 1 employed in a front-end circuit to serve as an amplifier which includes a parallel LC resonator used as a load circuit 3 borne by a gm amplifier 2 employed in the high-frequency amplifier 1.

That is to say, as shown in the circuit diagram, the high-frequency amplifier 1 employs the gm amplifier 2, the load circuit 3 as well as output terminals TO1 and TO2.

The load circuit 3 is provided between the output node of the gm amplifier 2 and the output terminals TO1 and TO2.

To put it in more detail, a node ND1 of the load circuit 3 is connected between the output node of the gm amplifier 2 and the output terminal TO1 whereas a node ND2 of the load circuit 3 is connected between the output terminal TO2 and a reference electric potential VSS.

The load circuit 3 employs a variable-capacitance capacitor C, an inductor L and a resistor R which is used as a resonant impedance element.

The variable-capacitance capacitor C, the inductor L and the resistor R are connected in parallel between the nodes ND1 and ND2 to form the load circuit 3.

Typically, the load circuit 3 has a configuration in which the capacitance of the variable-capacitance capacitor C is varied in order to change the frequency band of the received input signal, and the high-frequency amplifier 1 is compensated for a gain variation accompanying the change of the frequency band of the received input signal.

Figure 2:
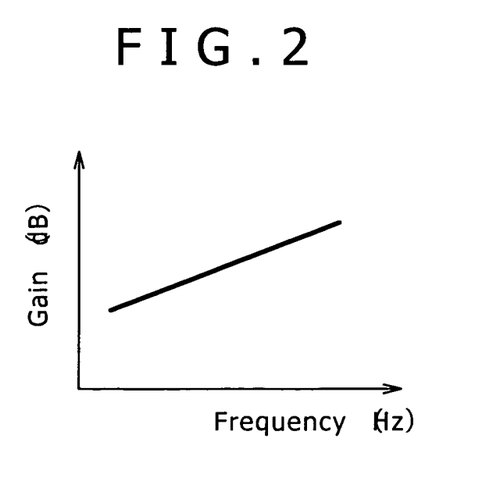
FIG. 2 is a diagram showing a graph indicating dependence of the gain of the high-frequency amplifier shown in the circuit diagram of FIG. 1 on the frequency of the input signal.

FIG. 2 is a diagram showing a graph indicating dependence of the gain of the high-frequency amplifier 1 on the frequency of the input signal. In the diagram of FIG. 2, the horizontal axis represents the frequency of the input signal whereas the vertical axis represents the gain of the high-frequency amplifier 1.

The resonant impedance Ro of the parallel LC resonator serving as the load borne by the gm amplifier 2 is an impedance at the resonant time of the parallel LC resonator. The resonant impedance Ro of the parallel LC resonator serving as the load rises as the frequency of the input signal increases. This is because the resonant impedance Ro of the parallel LC resonator is determined by $\omega LQ$. The gain of the high-frequency amplifier 1 is expressed in terms of a transconductance gm of the gm amplifier 2 and the resonance impedance Ro in accordance with the following equation:

$$\frac{Vout}{Vin} = gm \cdot Ro(\omega) \tag{1}$$

As a result, the high-frequency amplifier 1 shown in the circuit diagram of FIG. 1 has a gain with a frequency-dependence characteristic like the one shown in the diagram of FIG. 2. For more information, the reader is advised to refer to documents such as Japanese Patent Laid-Open No. 2008-160660.

SUMMARY OF THE INVENTION

As is obvious from the typical configuration of the high-frequency amplifier 1 shown in the circuit diagram of FIG. 1, by making use of the parallel LC resonator as the load borne by the RF amplifier, the gain variations from frequency to frequency increase. Thus, the operating condition of the high-frequency amplifier 1 cannot be sustained in a stable state throughout a wide frequency band.

As a result, the characteristics representing dependence of the SNR and the distortion performance on the frequency show increased dependence so that it is difficult to determine an optimum operating point.

As a method for decreasing the gain variations of the high-frequency amplifier 1, it is possible to add a circuit for adjusting a current which is supplied by of the high-frequency amplifier 1. With this method, however, the size of the circuit and the power consumption increase. In addition, this method has bad effects caused by typically increased noises and the like.

On top of that, in such circuit configuration, the impedance at the resonant time becomes very high. Thus, the amplitude of a signal appearing at the output node of the amplification section increases so that a limit is unavoidably imposed on the dynamic range due to deterioration of the distortion performance.

Addressing the problems described above, inventors of the present invention present a high-frequency amplifier that is capable of preventing the size of the circuit and the power consumption from increasing, suppressing the amplitude of a signal appearing at the output node of an amplification section so as to widen the dynamic range and sustaining the dependence of the gain on the frequency in a stable state. The inventors also present a radio communication apparatus which employs the high-frequency amplifier.

A high-frequency amplifier according to a first embodiment of the present invention employs: an amplification section having a function to convert an input signal from a voltage signal into a current signal and output the current signal; output terminals; and a load circuit which is connected to the output node of the amplification section and outputs the current signal output by the amplification section to the output terminals as a voltage signal. The load circuit has a first reactance element, a second reactance element and a third reactance element. A specific one of the two end nodes of the first reactance element is connected to a specific one of the two end nodes of the second reactance element at a connection point connected to the output node of the amplification section. The other one of the two end nodes of the second reactance element is connected to a specific one of the two end nodes of the third reactance element at a connection point connected to a specific one of the output terminals. The other one of the two end nodes of the first reactance element and the other one of the two end nodes of the third reactance element are connected to the other one of the output terminals so that the first reactance element and the third reactance element form a parallel circuit connected the other output terminal. Each of the first reactance element and the second reactance element is a capacitive reactance element or an inductive reactance element. The third reactance element is an inductive reactance element or a capacitive reactance element. The reactance of each of the first reactance element and the second reactance element is variable.

A radio-signal receiving apparatus according to a second embodiment of the present invention has a front-end section for carrying out processing determined in advance on a main signal on the basis of a local oscillation signal generated by a local oscillation section. The front-end section includes a high-frequency amplifier for inputting an input signal and outputting the main signal. The high-frequency amplifier employs: an amplification section having a function to convert the input signal from a voltage signal into a current signal and output the current signal; output terminals; and a load circuit which is connected to the output node of the amplification section and outputs the current signal output by the amplification section to the output terminals as a voltage signal. The load circuit has a first reactance element, a second reactance element and a third reactance element. A specific one of the two end nodes of the first reactance element is connected to a specific one of the two end nodes of the second reactance element at a connection point connected to the output node of the amplification section. The other one of the two end nodes of the second reactance element is connected to a specific one of the two end nodes of the third reactance element at a connection point connected to a specific one of the output terminals. The other one of the two end nodes of the first reactance element and the other one of the two end nodes of the third reactance element are connected to the other one of the output terminals so that the first reactance element and the third reactance element form a parallel circuit connected the other output terminal. Each of the first reactance element and the second reactance element is a capacitive reactance element or an inductive reactance element. The third reactance element is an inductive reactance element or a capacitive reactance element. The reactance of each of the first reactance element and the second reactance element is variable.

In accordance with the present invention, it is possible to prevent the size of the circuit and the power consumption from increasing, suppress the amplitude of a signal appearing at the output node of the amplification section so as to widen the dynamic range and sustain the dependence of the gain on the frequency as a flat characteristic in a stable state.

DETAILED DESCRIPTION OF THE PREFERRED EMBODIMENTS

Preferred embodiments of the present invention are explained by referring to the diagrams in chapters which are arranged in the following order:
1. First Embodiment (First Typical Configuration of the High-Frequency Amplifier)
2. Second Embodiment (Second Typical Configuration of the High-Frequency Amplifier)
3. Third Embodiment (Typical Configuration of the Front-End Section of a Radio Communication Apparatus)
4. Fourth Embodiment (Typical Configuration of the Tuner Section of a TV Receiver)

1. First Embodiment

Figure 3:
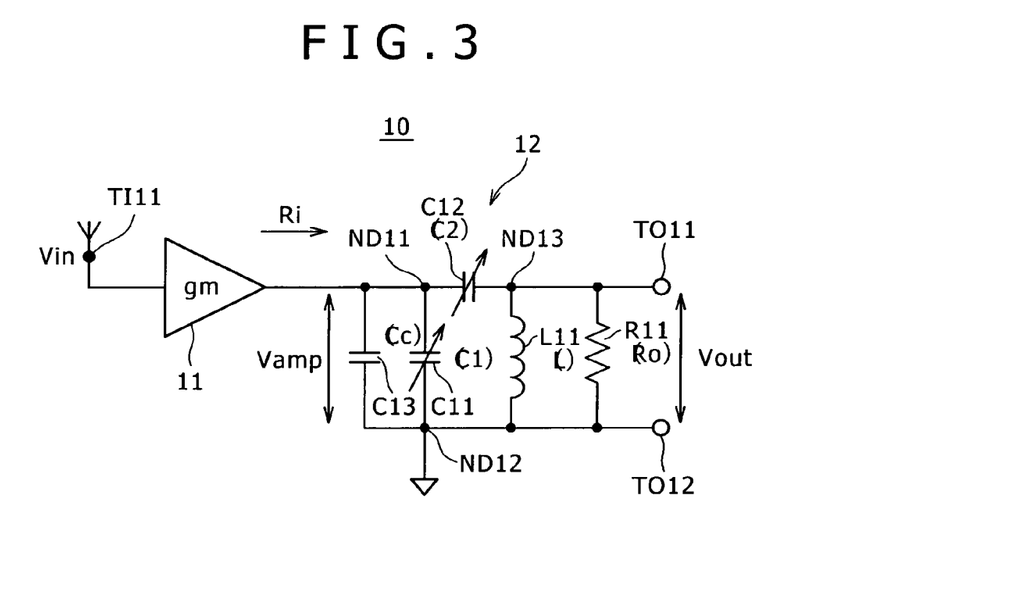
FIG. 3 is a circuit diagram showing a typical configuration of a high-frequency amplifier according to a first embodiment of the present invention.

FIG. 3 is a circuit diagram showing a typical configuration of a high-frequency amplifier 10 according to a first embodiment of the present invention.

As shown in the circuit diagram of FIG. 3, the high-frequency amplifier 10 according to the first embodiment of the present invention has an amplification section 11, a load circuit 12, an input terminal TI11, a first output terminal TO11, a second output terminal TO12, a first node ND11, a second node ND12 and a third node ND13. The amplification section 11 is a gm amplifier.

The load circuit 12 employed in the high-frequency amplifier 10 according to the first embodiment of the present invention is a tap capacitor resonator which includes a parallel variable-capacitance capacitor C11 also referred to as a first variable-capacitance capacitor C11, a series variable-capacitance capacitor C12 also referred to as a second variable-capacitance capacitor C12 and an inductor L11.

The high-frequency amplifier 10 adopts a load-stabilized method. In accordance with the load-stabilized method, by selecting a proper ratio of the capacitance C1 of the first variable-capacitance capacitor C11 employed in the tap capacitor resonator serving as the load circuit 12 to the capacitance C2 of the second variable-capacitance capacitor C12 also employed in the tap capacitor resonator, the impedance at the output node of the amplification section 11 employed in the high-frequency amplifier 10 can be reduced so that the amplitude of a signal appearing at the output node of the amplification section 11 employed in the high-frequency amplifier 10 can be decreased. As a result, the dynamic range can be widened.

In addition, if the capacitance C1 of the first variable-capacitance capacitor C11 employed in the load circuit 12 and the capacitance C2 of the second variable-capacitance capacitor C12 also employed in the load circuit 12 are to be changed over certain ranges, it is possible to provide a configuration in which the high-frequency amplifier 10 is configured to employ a constant-capacitance capacitor C13 having a constant capacitance Cc in parallel to the tap capacitor resonator which serves as the load circuit 12.

By adoption of this configuration, the ratio of the capacitance C1 of the first variable-capacitance capacitor C11 to the capacitance C2 of the second variable-capacitance capacitor C12 can be changed dependently on the frequency in order to bring about frequency dependence to an impedance conversion ratio to be described later so that the gain can be sustained at a constant value over a wide range.

A gm amplifier serving as the amplification section 11 is connected to the load circuit 12. Typically, the amplification section 11 is configured to include an FET (Field Effect Transistor) to serve as an amplification element for amplifying an RF signal supplied to the gate of the FET.

The gm amplifier serving as the amplification section 11 has a transconductance gm.

An input signal having a frequency determined in advance is received by an antenna which then supplies the input signal to the amplification section 11 by way of the input terminal TI11. Then, the amplification section 11 converts the input signal from a voltage signal Vin into a current signal.

The load circuit 12 is connected between the output node of the amplification section 11 and the output terminals of the high-frequency amplifier 10. The output terminals of the high-frequency amplifier 10 are the first output terminal TO11 and the second output terminal TO12 which are cited before.

The load circuit 12 employs the first variable-capacitance capacitor C11, the second variable-capacitance capacitor C12, the constant-capacitance capacitor C13, the inductor L11 and a resistor R11 which serves as a resonant impedance element having a resonant impedance Ro.

The first variable-capacitance capacitor C11 serves as a first reactance element which is a capacitive reactance element. By the same token, the second variable-capacitance capacitor C12 serves as a second reactance element which is also a capacitive reactance element. On the other hand, the inductor L11 serves as a third reactance element which is an inductive reactance element.

The load circuit 12 is connected to the first node ND11 which is the output node of the amplification section 11.

The second variable-capacitance capacitor C12 is connected between the first node ND11 and the first output terminal TO11. The second node ND12 is connected to the second output terminal TO12 set at the reference electric potential VSS which is typically the ground electric potential GND.

The series variable-capacitance capacitor C12 also referred to as the second variable-capacitance capacitor C12 and the inductor L11 are connected in series to the second output terminal TO12 whereas the parallel variable-capacitance capacitor C11 also referred to as the first variable-capacitance capacitor C11 and the inductor L11 are connected in parallel to the second output terminal TO12.

A specific one of the two end nodes of the first variable-capacitance capacitor C11 is connected to the first node ND11 whereas the other one of the two end nodes of the first variable-capacitance capacitor C11 is connected to the second node ND12.

A specific one of the two end nodes of the second variable-capacitance capacitor C12 is connected to the first node ND11 whereas the other one of the two end nodes of the second variable-capacitance capacitor C12 is connected to the first output terminal TO11 at a connection point.

The connection point between the specific end node of the second variable-capacitance capacitor C12 and the first output terminal TO11 serves as a third node ND13.

A specific one of the two end nodes of the constant-capacitance capacitor C13 is connected to the first node ND11 whereas the other one of the two end nodes of the constant-capacitance capacitor C13 is connected to the second node ND12.

A specific one of the two end nodes of the inductor L11 is connected to the third node ND13 whereas the other one of the two end nodes of the inductor L11 is connected to the second node ND12 which is connected to the second output terminal TO12. That is to say, the specific end node of the inductor L11 is connected to the other end node of the second variable-capacitance capacitor C12 whereas the other end node of the inductor L11 is connected to the second node ND12 which is connected to the second output terminal TO12.

The resistor R11 has a resonant impedance Ro which is equivalent to a resonant-time impedance $\omega LQ$. A specific one of the two end nodes of the resistor R11 is connected to the third node ND13 connected to the first output terminal TO11 whereas the other one of the two end nodes of the resistor R11 is connected to the second node ND12 which is connected to the second output terminal TO12.

In the following description, reference notation C1 denotes the capacitance of the first variable-capacitance capacitor C11, reference notation C2 denotes the capacitance of the second variable-capacitance capacitor C12 and reference notation Cc denotes the capacitance of the constant-capacitance capacitor C13.

In this embodiment, each of the capacitance C1 of the first variable-capacitance capacitor C11 and the capacitance C2 of the second variable-capacitance capacitor C12 is about 200 pF whereas the capacitance Cc of the constant-capacitance capacitor C13 is about 1 pF. On the other hand, the inductance L of the inductor L11 is about 200 nH.

Next, the operation of the high-frequency amplifier 10 shown in the circuit diagram of FIG. 3 is explained as follows.

The amplification section 11 converts an input signal Vin supplied to the input terminal TI11 into a current which is proportional to the input signal Vin. The current proportional to the input signal Vin flows to the load circuit 12 and finally becomes an output voltage which appears between the first output terminal TO11 and the second output terminal TO12.

In an equation given below, reference notation Vamp denotes the amplitude of a voltage appearing at the first node ND11 which serves as the output node of the amplification section 11. On the other hand, reference notation Vout denotes the amplitude of the output voltage described above. A voltage gain is defined as the ratio of the amplitude Vout of the output voltage to the amplitude Vamp of the voltage appearing at the first node ND11 which serves as the output node of the amplification section 11. The voltage gain is expressed by the equation cited above as follows.

$$\frac{Vout}{Vamp} = \left(\frac{C1 + Cc + C2}{C2}\right) = 1 + \frac{C1 + Cc}{C2} \quad (2)$$

An impedance Ri seen from the first node ND11, which serves as the output node of the amplification section 11, as the impedance of a circuit on the side of the first output terminal TO11 is expressed by the following equation:

$$Ri = \frac{Ro}{\left(1 + \frac{C1 + Cc}{C2}\right)^2} \quad (3)$$

As expressed by the above equation, the impedance Ri seen from the first node ND11 serving as the output node of the amplification section 11 is obtained by dividing the resonant impedance Ro by the square of the expression on the right-hand side of Eq. (2) given before. As described earlier, Eq. (2)

expresses the voltage gain defined as the ratio of the amplitude Vout of the output voltage to the amplitude Vamp of the voltage appearing at the first node ND11 which serves as the output node of the amplification section 11.

In addition, an output current flowing through the first node ND11 serving as the output node of the amplification section 11 is a product of the transconductance gm of the amplification section 11 and the input voltage signal Vin whereas the amplitude Vamp is a product of the output current and the impedance Ri. Thus, the amplitude Vamp can be expressed by the following equation:

$$Vamp = gm \cdot Vin \cdot Ri = gm \cdot Vin \frac{Ro(\omega)}{\left(1 + \frac{C1 + Cc}{C2}\right)^2} \quad (4)$$

As expressed by the above equation, the amplitude Vamp is inversely proportional to the square of the expression on the right-hand side of Eq. (2) given before. As described earlier, Eq. (2) expresses the voltage gain defined as the ratio of the amplitude Vout of the output voltage to the amplitude Vamp of the voltage appearing at the first node ND11 which serves as the output node of the amplification section 11.

As explained above, in the first embodiment, in comparison with a high-frequency amplifier employing the related-art parallel LC resonator, the amplitude Vamp is restricted due to the fact that the amplitude Vamp is inversely proportional to the square of the voltage gain. Thus, the distortion performance at the first node ND11 serving as the output node of the amplification section 11 can be improved. As a result, the dynamic range can be widened.

In a system operating at different frequencies covering a frequency band by changing the capacitances as is the case with the first embodiment, a proper constant capacitance Cc is selected so that the gain of the high-frequency amplifier 10 can be made flat.

The total gain of the high-frequency amplifier 10 is expressed by an equation given as follows.

$$\frac{Vout}{Vin} = \frac{Vout}{Vamp} \cdot \frac{Vamp}{vin} = gm \cdot \frac{Ro(\omega)}{\left(1 + \frac{C1 + Cc}{C2}\right)^2} \quad (5)$$

Since the resonant impedance Ro(ω) increases as the frequency increases, as described in the chapter with the title of "Description of the Related Art," the high-frequency amplifier shown in the circuit diagram of FIG. 1 to serve as an amplifier including a parallel LC resonator as its load has a total gain which is undesirably dependent on the frequency as shown in the diagram of FIG. 2.

In the high-frequency amplifier 10 adopting the load-stabilized method in accordance with the first embodiment of the present invention, on the other hand, as the frequency increases, the capacitance C1 of the first variable-capacitance capacitor C11 and the capacitance C2 of the second variable-capacitance capacitor C12 decrease but the capacitance Cc of the constant-capacitance capacitor C13 remains constant.

Thus, the impedance conversion ratio cited before increases as follows.

$$\text{Impedance conversion ratio} = 1 + \frac{C1 + Cc}{C2} \quad (6)$$

As described above, the resonant impedance Ro(ω) increases as the frequency increases and the impedance conversion ratio also increases as the frequency increases. As shown in the right-hand side expression of Eq. (5), the resonant impedance Ro(ω) serves as the numerator of the expression whereas the impedance conversion ratio serves as the denominator of the expression. Thus, as a result, the total gain of the high-frequency amplifier 10 is flat and all but independent of the frequency as shown by a solid-line curve A in the diagram of FIG. 4 to serve as a curve which represents the frequency dependence characteristic of the total gain of the high-frequency amplifier 10.

Figure 4:
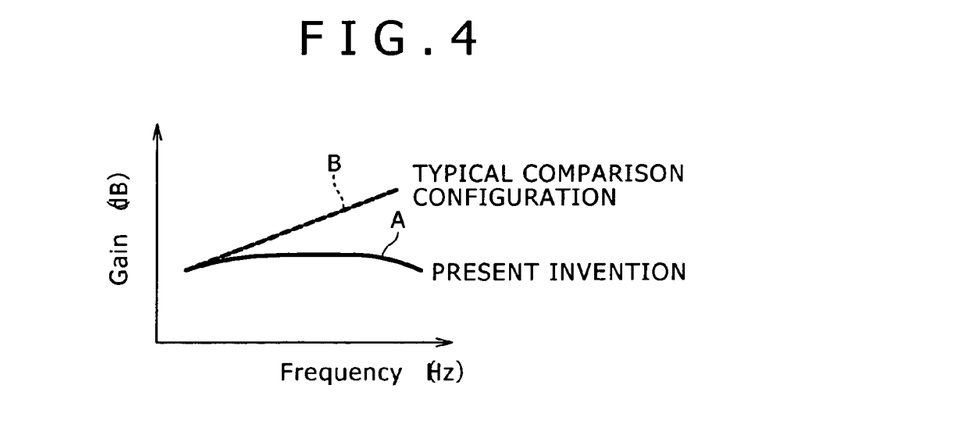
FIG. 4 is a diagram showing comparison of the dependence of the gain on the frequency for the high-frequency amplifier shown in the circuit diagram of FIG. 1 with the dependence of the gain on the frequency for the high-frequency amplifier shown in the circuit diagram of FIG. 3.

It is to be noted that FIG. 4 is a diagram showing comparison of the dependence of the gain on the frequency for the high-frequency amplifier shown in the circuit diagram of FIG. 1 with the dependence of the gain on the frequency for the high-frequency amplifier shown in the circuit diagram of FIG. 3.

In the diagram of FIG. 4, the horizontal axis represents the frequency whereas the vertical axis represents the gain.

In the diagram of FIG. 4, a characteristic represented by a solid-line graph A is a characteristic showing the dependence of the gain on the frequency for the high-frequency amplifier 10 shown in the circuit diagram of FIG. 3 to serve as high-frequency amplifier 10 according to the first embodiment whereas a characteristic represented by a dashed-line graph B is a characteristic showing the dependence of the gain on the frequency for the high-frequency amplifier 1 shown in the circuit diagram of FIG. 1.

As described above, according to the first embodiment, the following effects can be obtained.

By employing a tap capacitor resonator as the load borne by the amplification section 11 in the high-frequency amplifier 10, the amplitude of the signal appearing at the output node of the amplification section 11 employed in the high-frequency amplifier 10 can be reduced so that the dynamic range can be widened.

In addition, by connecting the constant-capacitance capacitor C13 and the first variable-capacitance capacitor C11 in parallel between the first node ND1 and the second node ND2, the dependence of the gain of the high-frequency amplifier 10 on the frequency of the input signal can be made flat as indicated by the solid-line graph A shown in the diagram of FIG. 4.

2. Second Embodiment

Figure 5:
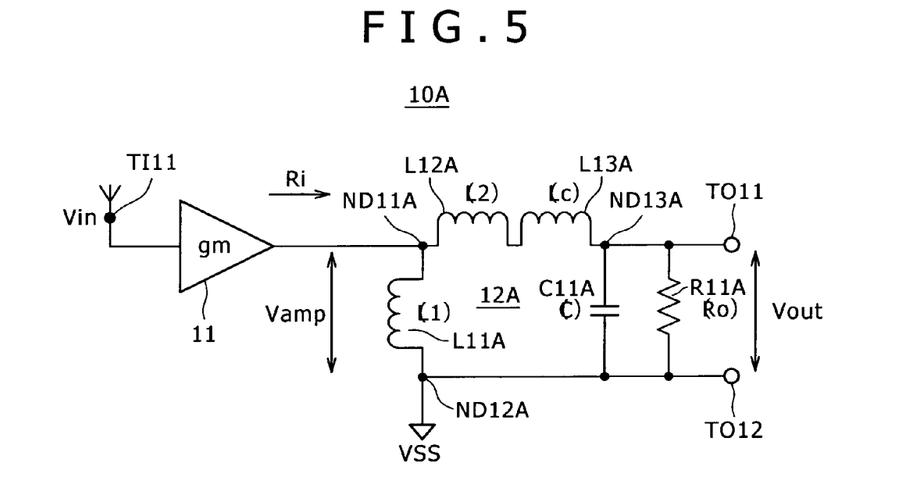
FIG. 5 is a circuit diagram showing a typical configuration of a high-frequency amplifier according to a second embodiment of the present invention.

FIG. 5 is a circuit diagram showing a typical configuration of a high-frequency amplifier 10A according to a second embodiment of the present invention.

The following description explains differences between the high-frequency amplifier 10A according to the second embodiment and the high-frequency amplifier 10 according to the first embodiment which has been described so far.

In the case of the high-frequency amplifier 10A according to the second embodiment, in place of the tap capacitor resonator employed in the high-frequency amplifier 10 according to the first embodiment, a tap inductor resonator is employed to serve as a load circuit 12A.

As shown in the circuit diagram of FIG. 5, the tap inductor resonator serving as the load circuit 12A employs a first variable-inductance inductor L11A, a second variable-inductance inductor L12A, a constant-inductance inductor L13A, a constant-capacitance capacitor C11A and a resistor R11a which serves as a resonant impedance element having a resonant impedance Ro.

The first variable-inductance inductor L11A serves as a first reactance element which is an inductive reactance element. By the same token, the second variable-inductance inductor L12A serves as a second reactance element which is also an inductive reactance element. On the other hand, the constant-capacitance capacitor C11A serves as a third reactance element which is a capacitive reactance element.

A specific one of the two end nodes of the first variable-inductance inductor L11A is connected to a first node ND11A whereas the other one of the two end nodes of the first variable-inductance inductor L11A is connected to a second node ND12A.

A specific one of the two end nodes of the second variable-inductance inductor L12A is connected to the first node ND11A whereas the other one of the two end nodes of the second variable-inductance inductor L12A is connected to a specific one of the two end nodes of the constant-inductance inductor L13A.

The other one of the two end nodes of the constant-inductance inductor L13A is connected to the first output terminal TO11. On a connection line connecting the other end node of the constant-inductance inductor L13A to the first output terminal TO11, a third node ND13A is created.

A specific one of the two end nodes of the constant-capacitance capacitor C11A is connected to the third node ND13A which is connected to the first output terminal TO11. The other one of the two end nodes of the constant-capacitance capacitor C11A is connected to the second node ND12A which is connected to the second output terminal TO12.

The resistor R11A has a resonant impedance Ro which is equivalent to a resonant-time impedance ωLQ. A specific one of the two end nodes of the resistor R11A is connected to the third node ND13A connected to the first output terminal TO11 whereas the other one of the two end nodes of the constant-capacitance capacitor C11A is connected to the second node ND12A which is connected to the second output terminal TO12.

In the following description, reference notation L1 denotes the inductance of the first variable-inductance inductor L11A, reference notation L2 denotes the inductance of the second variable-inductance inductor L12A and reference notation Lc denotes the inductance of the constant-inductance inductor L13A.

Next, the operation of the high-frequency amplifier 10A shown in the circuit diagram of FIG. 5 is explained as follows.

The amplification section 11 converts an input voltage signal Vin supplied to the input terminal TI11 into a current which is proportional to the input signal Vin. The current proportional to the input signal Vin flows to the load circuit 12A and finally becomes an output voltage which appears between the first output terminal TO11 and the second output terminal TO12.

Much like the first embodiment, in an equation given below, reference notation Vamp denotes the amplitude of a voltage appearing at the first node ND11 which serves as the output node of the amplification section 11. On the other hand, reference notation Vout denotes the amplitude of the output voltage. A voltage gain is defined as the ratio of the amplitude Vout of the output voltage to the amplitude Vamp of the voltage appearing at the first node ND11 which serves as the output node of the amplification section 11. The voltage gain is expressed by the equation cited above as follows.

$$\frac{Vout}{Vamp} = 1 + \frac{L2 + Lc}{L1} \quad (7)$$

An impedance Ri seen from the first node ND11A, which serves as the output node of the amplification section 11, as the impedance of a circuit on the side of the first output terminal TO11 is expressed by the following equation:

$$Ri = \frac{Ro}{\left(1 + \frac{L2 + Lc}{L1}\right)^2} \quad (8)$$

As expressed by the above equation, the impedance Ri seen from the first node ND11A serving as the output node of the amplification section 11 is obtained by dividing the resonant impedance Ro by the square of the expression on the right-hand side of Eq. (7) given before. As described earlier, Eq. (7) expresses the voltage gain defined as the ratio of the amplitude Vout of the output voltage to the amplitude Vamp of the voltage appearing at the first node ND11A which serves as the output node of the amplification section 11.

In addition, an output current flowing through the first node ND11A serving as the output node of the amplification section 11 is a product of the transconductance gm of the amplification section 11 and the input signal Vin whereas the amplitude Vamp is a product of the output current and the impedance Ri. Thus, the amplitude Vamp can be expressed by the following equation:

$$Vamp = gm \cdot Vin \cdot Ri = gm \cdot Vin \frac{Ro(\omega)}{\left(1 + \frac{L2 + Lc}{L1}\right)^2} \quad (9)$$

As expressed by the above equation, the amplitude Vamp is inversely proportional to the square of the expression on the right-hand side of Eq. (7) given before. As described earlier, Eq. (7) expresses the voltage gain defined as the ratio of the amplitude Vout of the output voltage to the amplitude Vamp of the voltage appearing at the first node ND11A which serves as the output node of the amplification section 11.

As explained above, in the case of the second embodiment, in comparison with a high-frequency amplifier employing the related-art parallel LC resonator, the amplitude Vamp is restricted due to the fact that the amplitude Vamp is inversely proportional to the square of the voltage gain. Thus, the distortion performance at the first node ND11A serving as the output node of the amplification section 11 can be improved. As a result, the dynamic range can be widened.

In a system operating at different frequencies covering a frequency band by changing the inductances as is the case with the second embodiment, a proper constant inductance Lc is selected so that the gain of the high-frequency amplifier 10A can made flat.

The total gain of the high-frequency amplifier 10A is expressed as follows.

$$\frac{Vout}{Vin} = \frac{Vout}{Vamp} \cdot \frac{Vamp}{vin} = gm \cdot \frac{Ro(\omega)}{\left(1 + \frac{L2 + Lc}{L1}\right)^2} \quad (10)$$

Since the resonant impedance $Ro(\omega)$ increases as the frequency increases, as described in the chapter with the title of "Description of the Related Art," the high-frequency amplifier shown in the circuit diagram of FIG. 1 to serve as an amplifier including a parallel LC resonator as its load has a gain which is undesirably dependent on the frequency as shown in the diagram of FIG. 2.

In the high-frequency amplifier 10A adopting the load-stabilized method in accordance with the second embodiment of the present invention, on the other hand, as the frequency increases, the inductance L1 of the first variable-inductance inductor L11A and the inductance L2 of the second variable-inductance inductor L12A decrease but the inductance Lc of the constant-inductance inductor L13A remains constant. Thus, the impedance conversion ratio of the high-frequency amplifier 10A increases as follows.

$$\text{Impedance conversion ratio} = 1 + \frac{L2 + Lc}{L1} \quad (11)$$

As described above, the resonant impedance $Ro(\omega)$ increases as the frequency increases and the impedance conversion ratio also increases as the frequency increases. As shown in the right-hand side expression of Eq. (10), the resonant impedance $Ro(\omega)$ serves as the numerator of the expression whereas the impedance conversion ratio serves as the denominator of the expression. Thus, as a result, the total gain of the high-frequency amplifier 10A is flat and all but independent of the frequency as shown by the solid-line curve A in the diagram of FIG. 4 to serve as a curve which represents the frequency dependence characteristic of the total gain of the high-frequency amplifier 10A.

As described above, according to the second embodiment, the following effects can be obtained.

By employing a tap inductor resonator as the load borne by the amplification section 11 in the high-frequency amplifier 10A, the amplitude of the signal appearing at the output node of the amplification section 11 employed in the high-frequency amplifier 10A can be reduced so that the dynamic range can be widened.

In addition, by connecting the constant-inductance inductor L13A and the second variable-inductance inductor L12A in series between the first node ND11A and the third node ND13A, the dependence of the gain of the high-frequency amplifier 10A on the frequency of the input signal can be made flat is indicated by the solid-line graph A shown in the diagram of FIG. 4.

3. Third Embodiment

Figure 6:
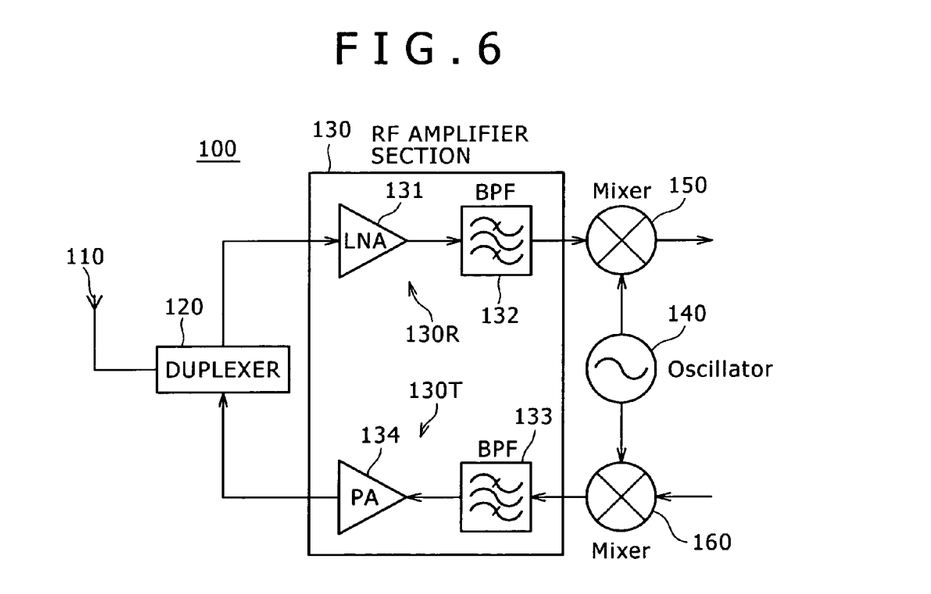
FIG. 6 is a block diagram showing a typical configuration of an RF front-end section employed in a radio communication apparatus having a high-frequency amplifier according to either of the embodiments.

FIG. 6 is a block diagram showing a typical configuration of an RF front-end section 100 employed in a radio communication apparatus to serve as an RF front-end section 100 having a high-frequency amplifier according to either, of the first and second embodiments which have been described so far.

The RF front-end section 100 shown in the block diagram of FIG. 6 employs an antenna 110, a duplexer 120, an RF amplifier section 130, a local oscillator 140 as well as mixers 150 and 160.

The duplexer 120 has a function to electrically separate a signal transmitting path from a signal receiving path so that the antenna 110 can be used for both transmitting and receiving signals.

The RF amplifier section 130 is configured to include a signal receiving system 130R and a signal transmitting system 130T.

The signal receiving system 130R has an LNA (Low Noise Amplifier) 131 for amplifying an input signal received by the antenna 110 at a gain determined in advance. The signal receiving system 130R also has a BPF (Band Pass Filter) 132 for passing one of signals output by the LNA 131 as a signal having a desired frequency in a frequency band and for supplying the signal having the desired frequency in the frequency band to the mixer 150 as a main signal.

The signal transmitting system 130T has a BPF 133 for passing one of signals output by the mixer 160 as a signal having a frequency in a desired signal transmitting frequency in a frequency band. The signal transmitting system 130T also has a PA (Power Amplifier) 134 for amplifying the signal passed by the BPF 133 and supplying the amplified signal to the duplexer 120.

The mixer 150 is a section for mixing a signal output by the BPF 132 with a local oscillation signal generated by the local oscillator 140 in order to output typically an IF (Intermediate Frequency) signal.

The mixer 160 is a section for mixing a signal output from a transmission processing system with the local oscillation signal generated by the local oscillator 140 in order to output a signal to be supplied to the BPF 133. It is to be noted that the transmission processing system itself is not shown in the block diagram of FIG. 6.

The LNA 131 employed in the RF front-end section 100 according to the third embodiment is the high-frequency amplifier 10 according to the first embodiment or the high-frequency amplifier 10A according to the second embodiment.

Thus, the amplitude of a signal appearing at the output node of an amplification section employed in the LNA 131 can be reduced so that the dynamic range can be widened. In addition, the dependence of the gain on the frequency of the input signal can be sustained in a flat state.

4. Fourth Embodiment

Figure 7:
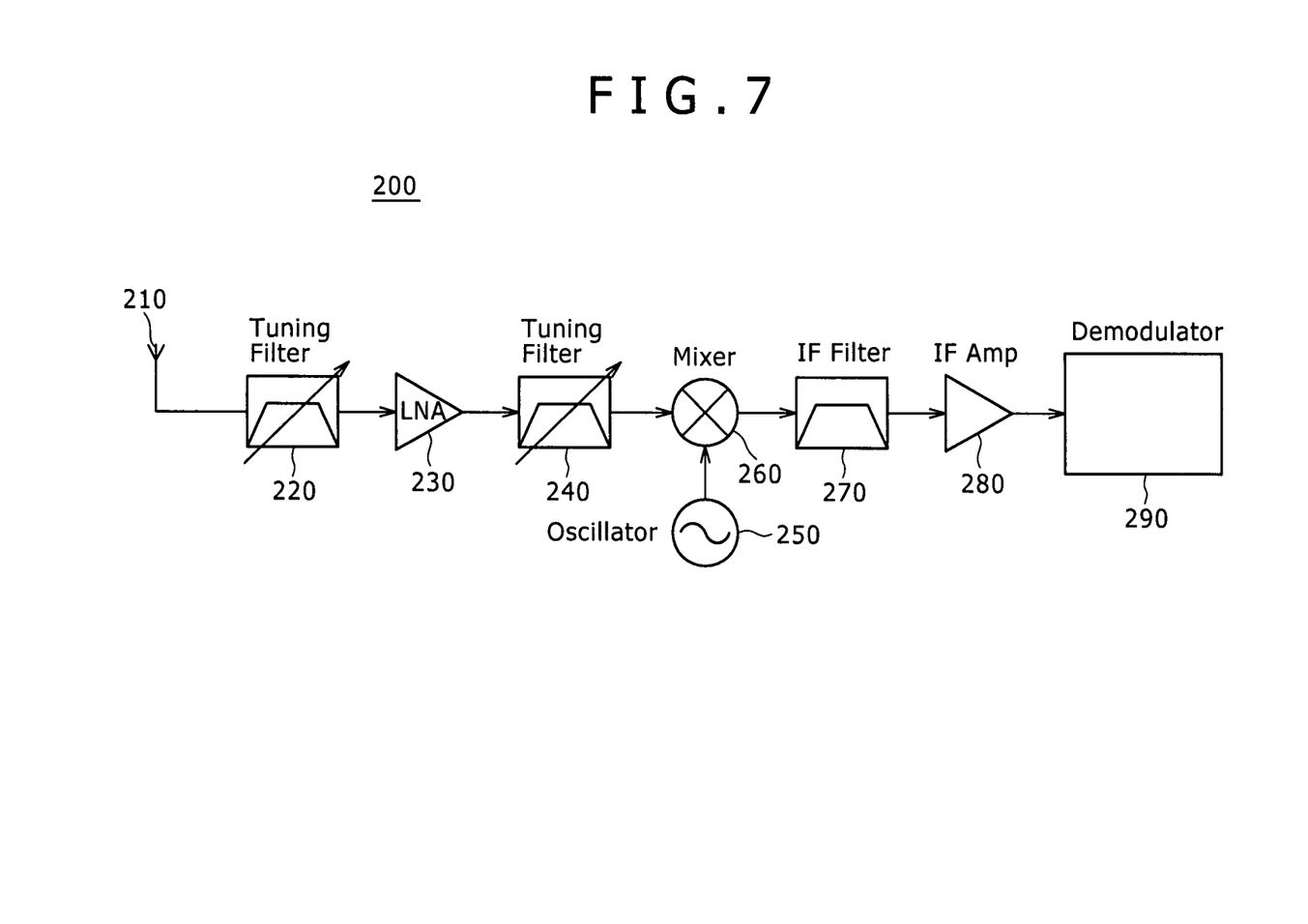
FIG. 7 is a block diagram showing a typical configuration of a tuner section employed in a TV receiver having a high-frequency amplifier according to either of the embodiments.

FIG. 7 is a block diagram showing a typical configuration of a tuner section 200 employed in a TV receiver to serve as a tuner section 200 having a high-frequency amplifier according to either of the first and second embodiments which have been described before.

As shown in the block diagram of FIG. 7, the tuner section 200 has a signal receiving antenna 210, a tuning filter 220, an LNA 230, another tuning filter 240, a local oscillator 250 and a mixer 260.

In addition, the tuner section 200 also employs an IF filter 270, an IF amplifier 280 and a demodulator 290.

The front-end section of the tuner section 200 includes the signal receiving antenna 210, the tuning filter 220, the LNA 230, the other tuning filter 240, the local oscillator 250, the mixer 260, the IF filter 270 and the IF amplifier 280.

A broadcast wave received by the signal receiving antenna 210 is extracted by the tuning filter 220 as a received signal having the desired frequency. The LNA 230 amplifies the signal extracted by the tuning filter 220. The tuning filter 240 extracts the signal, which has been amplified by the LNA 230, as a signal having the desired frequency. The tuning filter 240 supplies the signal extracted thereby to the mixer 260 as a main signal.

The mixer 260 mixes the main signal received from the tuning filter 240 with a local oscillation signal generated by the local oscillator 250 in order to output an IF (Intermediate Frequency) signal to the IF filter 270. The IF filter 270 removes unnecessary components from the IF signal supplied by the mixer 260 and outputs the remaining signal to the IF amplifier 280. The IF amplifier 280 amplifies the remaining signal received from the IF filter 270 and supplies the amplified signal to the demodulator 290. The demodulator 290 demodulates the signal amplified by the IF amplifier 280.

The LNA 230 employed in the tuner section 200 according to the fourth embodiment is the high-frequency amplifier 10 according to the first embodiment or the high-frequency amplifier 10A according to the second embodiment.

Thus, the amplitude of a signal appearing at the output node of an amplification section employed in the LNA 230 can be reduced so that the dynamic range can be widened. In addition, the dependence of the gain on the frequency of the input signal can be sustained in a flat state.

The tuner section of a TV receiver has been taken as a typical electronic apparatus (that is, a typical radio communication apparatus) to which the high-frequency amplifier 10 according to the first embodiment or the high-frequency amplifier 10A according to the second embodiment is applied. It is to be noted, however, that the present invention can also be applied to a wide range of electronic apparatus such as a potable apparatus which has a receiver for receiving RF signals.

The present application contains subject matter related to that disclosed in Japanese Priority Patent Application JP 2009-246539 filed in the Japan Patent Office on Oct. 27, 2009, the entire content of which is hereby incorporated by reference.

It should be understood by those skilled in the art that a variety of modifications, combinations, sub-combinations and alterations may occur, depending on design requirements and other factors as far as they are within the scope of the appended claims or the equivalents thereof.

What is claimed is:

1. A high-frequency amplifier comprising:
an amplification section having a function to convert an input signal from a voltage signal into a current signal and output said current signal;
output terminals; and
a load circuit which is connected to the output node of said amplification section and outputs said current signal output by said amplification section to said output terminals as a voltage signal,
wherein said load circuit has a first reactance element, a second reactance element and a third reactance element,
wherein a specific one of the two end nodes of said first reactance element is connected to a specific one of the two end nodes of said second reactance element at a connection point connected to said output node of said amplification section,
wherein the other one of said two end nodes of said second reactance element is connected to a specific one of the two end nodes of said third reactance element at a connection point connected to a specific one of said output terminals,
wherein the other one of said two end nodes of said first reactance element and the other one of said two end nodes of said third reactance element are connected to the other one of said output terminals so that said first reactance element and said third reactance element form a parallel circuit connected said other output terminal,
wherein each of said first reactance element and said second reactance element is a capacitive reactance element or an inductive reactance element,
wherein said third reactance element is an inductive reactance element or a capacitive reactance element,
wherein the reactance of each of said first reactance element and said second reactance element is variable,
wherein said load circuit includes a tap capacitor resonator including:
said first reactance element implemented as a first variable-capacitance capacitor having a variable capacitance,
said second reactance element implemented as a second variable-capacitance capacitor having a variable capacitance; and
said third reactance element implemented as an inductor,
wherein said first variable-capacitance capacitor serving as said first reactance element and a constant-capacitance capacitor having a constant capacitance are connected in parallel to said output node of said amplification section.

2. A high-frequency amplifier comprising:
an amplification section having a function to convert an input signal from a voltage signal into a current signal and output said current signal;
output terminals; and
a load circuit which is connected to the output node of said amplification section and outputs said current signal output by said amplification section to said output terminals as a voltage signal,
wherein said load circuit has a first reactance element, a second reactance element and a third reactance element,
wherein a specific one of the two end nodes of said first reactance element is connected to a specific one of the two end nodes of said second reactance element at a connection point connected to said output node of said amplification section,
wherein the other one of said two end nodes of said second reactance element is connected to a specific one of the two end nodes of said third reactance element at a connection point connected to a specific one of said output terminals,
wherein the other one of said two end nodes of said first reactance element and the other one of said two end nodes of said third reactance element are connected to the other one of said output terminals so that said first reactance element and said third reactance element form a parallel circuit connected said other output terminal,
wherein each of said first reactance element and said second reactance element is a capacitive reactance element or an inductive reactance element,
wherein said third reactance element is an inductive reactance element or a capacitive reactance element, and
wherein the reactance of each of said first reactance element and said second reactance element is variable,
wherein said load circuit includes a tap inductor resonator including:
said first reactance element implemented as a first variable-inductance inductor having a variable inductance;
said second reactance element implemented as a second variable-inductance inductor having a variable inductance; and
said third reactance element implemented as a capacitor, wherein a constant-inductance inductor having a constant inductance is connected between a specific one of the two end nodes of said second reactance element implemented as said second variable-inductance inductor and the other one of the two end nodes of said third reactance element implemented as said capacitor.

3. A high-frequency amplifier comprising:

a first terminal of a constant-capacitance capacitor directly electrically connected to a first terminal of a first variable-capacitance capacitor and to a first terminal of a second variable-capacitance capacitor;

a first terminal of a resistor directly electrically connected to a first terminal of an inductor and to a second terminal of the second variable-capacitance capacitor;

a second terminal of the constant-capacitance capacitor directly electrically connected to a second terminal of the inductor and to a second terminal of the first variable-capacitance capacitor;

a second terminal of the resistor directly electrically connected to said second terminal of the constant-capacitance capacitor.

4. The high-frequency amplifier according to claim 3, further comprising:

an amplification section configured to output a proportional signal to said first terminal of the constant-capacitance capacitor, said proportional signal being an input signal that has been amplified.

5. The high-frequency amplifier according to claim 4, wherein said amplification section is configured to receive said input signal at an input terminal, said amplification section being configured to convert into said proportional signal.

6. The high-frequency amplifier according to claim 3, wherein said second terminal of the first variable-capacitance capacitor is directly electrically connected to ground.

7. The high-frequency amplifier according to claim 3, wherein a capacitance of the first variable-capacitance capacitor is variable.

8. The high-frequency amplifier according to claim 3, wherein a capacitance of the second variable-capacitance capacitor is variable.

9. The high-frequency amplifier according to claim 3, wherein a capacitance of the constant-capacitance capacitor is non-variable.

10. A radio communication apparatus comprising:

a local oscillator configured to output a local oscillation signal;

a mixer configured to mix a main signal with said local oscillation signal, said main signal being output from the high-frequency amplifier of claim 3.

11. A high-frequency amplifier comprising:

a first terminal of a first variable-inductance inductor directly electrically connected to a first terminal of a second variable-inductance inductor;

a second terminal of the second variable-inductance inductor directly electrically connected to a first terminal of a constant-inductance inductor;

a first terminal of a resistor directly electrically connected to a second terminal of the constant-inductance inductor and to a first terminal of a constant-capacitance capacitor;

a second terminal of the resistor directly electrically connected to a second terminal of the constant-capacitance capacitor and to a second terminal of the first variable-inductance inductor.

12. The high-frequency amplifier according to claim 11, wherein said second terminal of the first variable-inductance inductor is directly electrically connected to ground.

13. The high-frequency amplifier according to claim 11, wherein an inductance of the first variable-inductance inductor is variable.

14. The high-frequency amplifier according to claim 11, wherein an inductance of the second variable-inductance inductor is variable.

15. The high-frequency amplifier according to claim 11, wherein a capacitance of the constant-capacitance capacitor is non-variable.

16. The high-frequency amplifier according to claim 11, wherein an inductance of the constant-inductance inductor is non-variable.

17. The high-frequency amplifier according to claim 11, further comprising:

an amplification section configured to output a proportional signal to said first terminal of the first variable-inductance inductor, said proportional signal being an input signal that has been amplified.

18. The high-frequency amplifier according to claim 17, wherein said amplification section is configured to receive said input signal at an input terminal, said amplification section being configured to convert into said proportional signal.

19. A radio communication apparatus comprising:

a local oscillator configured to output a local oscillation signal;

a mixer configured to mix a main signal with said local oscillation signal, said main signal being output from the high-frequency amplifier of claim 11.

* * * * *